United States Patent
Janai

(10) Patent No.: US 7,590,001 B2
(45) Date of Patent: Sep. 15, 2009

(54) FLASH MEMORY WITH OPTIMIZED WRITE SECTOR SPARES

(75) Inventor: Meir Janai, Zikhron-Ya'aqov (IL)

(73) Assignee: Saifun Semiconductors Ltd., Netanya (IL)

( * ) Notice: Subject to any disclaimer, the term of this patent is extended or adjusted under 35 U.S.C. 154(b) by 86 days.

(21) Appl. No.: 11/958,425

(22) Filed: Dec. 18, 2007

(65) Prior Publication Data

US 2009/0154242 A1    Jun. 18, 2009

(51) Int. Cl.
*G11C 16/06* (2006.01)
*G11C 16/04* (2006.01)

(52) U.S. Cl. .................. 365/185.09; 365/185.11; 365/185.33; 365/200

(58) Field of Classification Search ........... 365/185.09
See application file for complete search history.

(56) References Cited

U.S. PATENT DOCUMENTS

| | | | |
|---|---|---|---|
| 3,895,360 | A | 7/1975 | Cricchi et al. |
| 4,281,397 | A | 7/1981 | Neal et al. |
| 4,342,102 | A | 7/1982 | Puar |
| 4,388,705 | A | 6/1983 | Sheppard |
| 4,389,705 | A | 6/1983 | Sheppard |
| 4,527,257 | A | 7/1985 | Cricchi |
| 4,586,163 | A | 4/1986 | Koiki |
| 4,760,555 | A | 7/1988 | Gelsomini et al. |
| 4,761,764 | A | 8/1988 | Watanabe |
| 4,888,735 | A | 12/1989 | Lee et al. |
| 4,916,671 | A | 4/1990 | Ichiguchi |
| 5,027,321 | A | 6/1991 | Park |
| 5,117,389 | A | 5/1992 | Yiu |

(Continued)

FOREIGN PATENT DOCUMENTS

EP    1071096    9/2003

(Continued)

OTHER PUBLICATIONS

"Semiconductor Memory: Non-Volatile Memory (NVM)", National University of Singapore, Department of Electrical and Computer Engineering, www.ece.nus.edu.sg/stfpage/elezhucz/myweb/NVM.pdf.

(Continued)

*Primary Examiner*—Son L Mai
(74) *Attorney, Agent, or Firm*—EMPK & Shiloh, LLP

(57) ABSTRACT

In certain exemplary embodiments, a memory device with optimized write sectors has a plurality P of memory write sectors and N memory spare sectors Cumulatively, the memory write sectors correspond to the specified storage capacity of the memory. The number N of spares is approximately equal to the number of write sectors expected to be decommissioned within an operational lifetime of the memory, which can be determined by empirical measurement. A method, by way of non-limiting example, of making memory includes specifying a plurality P of write sectors which define a specified storage capacity of a memory device, determining a number N of spare sectors, and making a memory device with about P write sectors and about N spare sectors. The number N can be determined, by way of example, by summing the infant mortality with the random failure of write sectors. One exemplary tool to determine infant mortality and random failure is to empirically create a cycle-based bathtub curve having infant mortality, random failure, and wear out regions.

20 Claims, 7 Drawing Sheets

U.S. PATENT DOCUMENTS

| | | | |
|---|---|---|---|
| 5,204,835 A | 4/1993 | Eitan | |
| 5,241,497 A | 8/1993 | Komarek | |
| 5,268,861 A | 12/1993 | Hotta | |
| 5,293,563 A | 3/1994 | Ohta | |
| 5,295,092 A | 3/1994 | Hotta | |
| 5,295,108 A | 3/1994 | Higa | |
| 5,305,262 A | 4/1994 | Yoneda | |
| 5,315,541 A | 5/1994 | Harari et al. | |
| 5,335,198 A | 8/1994 | Van Buskirk et al. | |
| 5,345,425 A | 9/1994 | Shikatani | |
| 5,352,620 A | 10/1994 | Komori et al. | |
| 5,361,343 A | 11/1994 | Kosonocky et al. | |
| 5,375,094 A | 12/1994 | Naruke | |
| 5,381,374 A | 1/1995 | Shiraishi et al. | |
| 5,394,355 A | 2/1995 | Uramoto et al. | |
| 5,399,891 A | 3/1995 | Yiu et al. | |
| 5,412,601 A | 5/1995 | Sawada et al. | |
| 5,422,844 A | 6/1995 | Wolstenholme et al. | |
| 5,424,978 A | 6/1995 | Wada et al. | |
| 5,426,605 A | 6/1995 | Van Berkel et al. | |
| 5,428,621 A | 6/1995 | Mehrotra et al. | |
| 5,434,825 A | 7/1995 | Harari | |
| 5,436,478 A | 7/1995 | Bergemont | |
| 5,440,505 A | 8/1995 | Fazio et al. | |
| 5,467,308 A | 11/1995 | Chang et al. | |
| 5,477,499 A | 12/1995 | Van Buskirk et al. | |
| 5,495,440 A | 2/1996 | Asakura | |
| 5,508,968 A | 4/1996 | Collins et al. | |
| 5,521,870 A | 5/1996 | Ishikawa | |
| 5,523,972 A | 6/1996 | Rashid et al. | |
| 5,530,803 A | 6/1996 | Chang et al. | |
| 5,557,570 A | 9/1996 | Iwahashi | |
| 5,563,823 A | 10/1996 | Yui et al. | |
| 5,566,125 A | 10/1996 | Fazio et al. | |
| 5,583,808 A | 12/1996 | Brahmbhatt | |
| 5,590,068 A | 12/1996 | Bergemont | |
| 5,590,074 A | 12/1996 | Akaogi et al. | |
| 5,596,527 A | 1/1997 | Tomioka et al. | |
| 5,600,586 A | 2/1997 | Lee | |
| 5,617,357 A | 4/1997 | Haddad et al. | |
| 5,619,452 A | 4/1997 | Miyauchi | |
| 5,623,438 A | 4/1997 | Guritz et al. | |
| 5,627,790 A | 5/1997 | Golla et al. | |
| 5,650,959 A | 7/1997 | Hayashi et al. | |
| 5,657,332 A | 8/1997 | Auclair et al. | |
| 5,661,060 A | 8/1997 | Gill et al. | |
| 5,677,867 A | 10/1997 | Hazani | |
| 5,696,929 A | 12/1997 | Hasbun et al. | |
| 5,712,815 A | 1/1998 | Bill et al. | |
| 5,717,632 A | 2/1998 | Richart et al. | |
| 5,777,919 A | 7/1998 | Chi-Yung et al. | |
| 5,781,476 A | 7/1998 | Seki et al. | |
| 5,781,478 A | 7/1998 | Takeuchi et al. | |
| 5,812,456 A | 9/1998 | Hull et al. | |
| 5,812,457 A | 9/1998 | Arase | |
| 5,825,683 A | 10/1998 | Chang | |
| 5,825,686 A | 10/1998 | Schmitt-Landsiedel et al. | |
| 5,828,601 A | 10/1998 | Hollmer et al. | |
| 5,835,935 A | 11/1998 | Estakhri et al. | |
| 5,862,076 A | 1/1999 | Eitan | |
| 5,864,164 A | 1/1999 | Wen | |
| 5,867,429 A | 2/1999 | Chen et al. | |
| 5,870,334 A | 2/1999 | Hemink et al. | |
| 5,870,335 A | 2/1999 | Khan et al. | |
| 5,875,128 A | 2/1999 | Ishizuka | |
| 5,877,537 A | 3/1999 | Aoki | |
| 5,886,927 A | 3/1999 | Takeuci | |
| 5,898,186 A * | 4/1999 | Farnworth et al. ............ 257/48 | |
| 5,910,924 A | 6/1999 | Tanaka et al. | |
| 5,920,503 A | 7/1999 | Lee et al. | |
| 5,920,507 A | 7/1999 | Takeuchi et al. | |
| 5,930,195 A | 7/1999 | Komatsu | |
| 5,933,366 A | 8/1999 | Yoshikawa | |
| 5,936,888 A | 8/1999 | Sugawara | |
| 5,940,332 A | 8/1999 | Artieri | |
| 5,949,714 A | 9/1999 | Hemink et al. | |
| 5,963,465 A | 10/1999 | Eitan | |
| 5,991,517 A | 11/1999 | Harari et al. | |
| 6,000,006 A | 12/1999 | Bruce et al. | |
| 6,030,871 A | 2/2000 | Eitan | |
| 6,034,403 A | 3/2000 | Wu | |
| 6,044,019 A | 3/2000 | Cernea et al. | |
| 6,044,022 A | 3/2000 | Nachumovsky | |
| 6,064,591 A | 5/2000 | Takeuchi et al. | |
| 6,074,916 A | 6/2000 | Cappelletti | |
| 6,081,456 A | 6/2000 | Dadashev | |
| 6,084,794 A | 7/2000 | Lu et al. | |
| 6,091,640 A | 7/2000 | Kawahara et al. | |
| 6,130,452 A | 10/2000 | Lu et al. | |
| 6,147,904 A | 11/2000 | Liron | |
| 6,163,048 A | 12/2000 | Hirose et al. | |
| 6,163,484 A | 12/2000 | Uekubo | |
| 6,175,519 B1 | 1/2001 | Lu et al. | |
| 6,181,597 B1 | 1/2001 | Nachumovsky | |
| 6,201,282 B1 | 3/2001 | Eitan | |
| 6,218,695 B1 | 4/2001 | Nachumovsky | |
| 6,222,762 B1 | 4/2001 | Guteman et al. | |
| 6,233,180 B1 | 5/2001 | Eitan et al. | |
| 6,240,040 B1 | 5/2001 | Akaogi et al. | |
| 6,252,442 B1 | 6/2001 | Malherbe | |
| 6,252,799 B1 | 6/2001 | Liu et al. | |
| 6,256,231 B1 | 7/2001 | Lavi et al. | |
| 6,275,414 B1 | 8/2001 | Randolph et al. | |
| 6,282,133 B1 | 8/2001 | Nakagawa et al. | |
| 6,282,145 B1 | 8/2001 | Tran et al. | |
| 6,285,574 B1 | 9/2001 | Eitan | |
| 6,285,589 B1 | 9/2001 | Kajitani | |
| 6,304,485 B1 | 10/2001 | Harari et al. | |
| 6,307,807 B1 | 10/2001 | Sakui et al. | |
| 6,326,265 B1 | 12/2001 | Liu et al. | |
| 6,331,950 B1 | 12/2001 | Kuo et al. | |
| 6,335,874 B1 | 1/2002 | Eitan | |
| 6,339,556 B1 | 1/2002 | Watanabe | |
| 6,351,415 B1 | 2/2002 | Kushnarenko | |
| 6,374,337 B1 | 4/2002 | Estakhri | |
| 6,400,607 B1 | 6/2002 | Pasotti et al. | |
| 6,418,506 B1 | 7/2002 | Pashley et al. | |
| 6,438,035 B2 | 8/2002 | Yamamoto et al. | |
| 6,449,188 B1 | 9/2002 | Fastow | |
| 6,449,190 B1 | 9/2002 | Bill | |
| 6,469,935 B2 | 10/2002 | Hayashi | |
| 6,496,414 B2 | 12/2002 | Kasa et al. | |
| 6,504,756 B2 | 1/2003 | Gonzalez et al. | |
| 6,525,969 B1 | 2/2003 | Kurihara et al. | |
| 6,529,412 B1 | 3/2003 | Chen et al. | |
| 6,532,173 B2 | 3/2003 | Iioka et al. | |
| 6,538,270 B1 | 3/2003 | Randolph et al. | |
| 6,570,211 B1 | 5/2003 | He et al. | |
| 6,574,139 B2 | 6/2003 | Kurihara | |
| 6,577,547 B2 | 6/2003 | Ukon | |
| 6,593,606 B1 | 7/2003 | Randolph et al. | |
| 6,614,686 B1 | 9/2003 | Kawamura | |
| 6,614,690 B2 | 9/2003 | Roohparvar | |
| 6,614,692 B2 | 9/2003 | Eliyahu et al. | |
| 6,633,496 B2 | 10/2003 | Maayan et al. | |
| 6,633,499 B1 | 10/2003 | Eitan et al. | |
| 6,633,956 B1 | 10/2003 | Mitani | |
| 6,639,837 B2 | 10/2003 | Takano et al. | |
| 6,643,178 B2 | 11/2003 | Kurihara | |
| 6,744,692 B2 | 6/2004 | Shiota et al. | |
| 6,839,280 B1 | 1/2005 | Chindalore et al. | |
| 6,870,772 B1 | 3/2005 | Nitta et al. | |
| 6,885,585 B2 | 4/2005 | Maayan et al. | |
| 6,885,590 B1 | 4/2005 | Zheng et al. | |

| | | | |
|---|---|---|---|
| 6,912,160 B2 | 6/2005 | Yamada | |
| 6,917,541 B2 | 7/2005 | Shimbayashi et al. | |
| 6,917,544 B2 | 7/2005 | Maayan et al. | |
| 6,954,393 B2 | 10/2005 | Lusky et al. | |
| 6,977,410 B2 | 12/2005 | Naso et al. | |
| 6,981,188 B2 | 12/2005 | Galzur et al. | |
| 6,990,001 B2 | 1/2006 | Ma et al. | |
| 6,996,692 B2 | 2/2006 | Kuono | |
| 7,043,672 B2 | 5/2006 | Merritt | |
| 7,061,816 B2 * | 6/2006 | Sugiura et al. | 365/200 |
| 7,447,944 B2 * | 11/2008 | Hu | 714/42 |
| 7,523,013 B2 * | 4/2009 | Gorobets et al. | 702/177 |
| 2001/0006477 A1 | 7/2001 | Banks | |
| 2001/0012216 A1 * | 8/2001 | Taura et al. | 365/185.09 |
| 2002/0004878 A1 | 1/2002 | Norman | |
| 2002/0004921 A1 | 1/2002 | Muranaka et al. | |
| 2003/0131186 A1 | 7/2003 | Buhr | |
| 2003/0135793 A1 * | 7/2003 | Craig et al. | 714/42 |
| 2003/0142544 A1 | 7/2003 | Maayan et al. | |
| 2003/0145176 A1 | 7/2003 | Dvir et al. | |
| 2003/0206435 A1 | 11/2003 | Takahashi | |
| 2003/0208663 A1 | 11/2003 | Van Buskirk et al. | |
| 2003/0214844 A1 | 11/2003 | Iijima | |
| 2004/0205290 A1 * | 10/2004 | Shinagawa et al. | 711/103 |
| 2005/0185482 A1 * | 8/2005 | Sugimoto et al. | 365/200 |
| 2008/0082725 A1 * | 4/2008 | Elhamias | 711/103 |

FOREIGN PATENT DOCUMENTS

| | | |
|---|---|---|
| EP | 1223586 | 8/2005 |
| EP | 1324343 | 8/2005 |
| EP | 1126468 | 12/2005 |
| EP | 1164597 | 8/2006 |
| JP | 08106791 | 4/1996 |
| JP | 09017981 | 1/1997 |
| JP | 10055691 | 2/1998 |
| JP | 11354758 | 12/1999 |
| JP | 20315392 | 11/2000 |
| JP | 1085646 | 3/2001 |
| JP | 21118392 | 4/2001 |
| JP | 22216488 | 8/2002 |
| WO | WO9931670 | 6/1999 |
| WO | WO03036651 | 5/2003 |
| WO | WO03063168 | 7/2003 |
| WO | WO03088260 | 10/2003 |
| WO | WO03088261 | 10/2003 |

OTHER PUBLICATIONS

Jung, et al, "A 117-mm2 3.3-V Only 128-Mb Multilevel NAND Flash Memory for Mass Storage Applications", IEEE Journal of Solid-State Circuits, vol. 31, No. 11, Nov. 1996, pp. 1575-1583.

Compardo, et al, "40-mm2 3-V Only 5-MHz 64-Mb 2-b/cell CHE NOR Flash Memory", IEEE Journal of Solid-State Circuits, vol. 35, No. 11, Nov. 2000, pp. 1655-1667.

Lin, et al., "Novel Source-Controlled Self-Verified Programming for Multilevel EEPROM's", IEEE Transactions on Electron Devices, vol. 47, No. 6, Jun. 2000, pp. 1166-1174.

Tanaka, et al, "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.

Umezawa, et al, "A 5-V-Only Operation 0.6μm Flash EEPROM with Row Decoder Scheme in Triple-Well Structure", IEEE Journal of Solid-State Circuits, vol. 27, Nov. 1992, p. 1540-1546.

"Philips Research-Technologies-Embedded Nonvolatile Memories", http://rsearch.phililps.com/technologies/ics/nvmemories/index.html, Jun. 9, 2006.

* cited by examiner

FLASH MEMORY WITH OPTIMIZED WRITE SECTOR SPARES

BACKGROUND

Exemplary embodiments disclosed herein pertain to digital memory used in digital electronic devices. More particularly, exemplary embodiments disclosed herein pertain to flash memory devices.

Computers use RAM to hold the program code and data during computation. Many types of RAM are volatile, which means that unlike some other forms of computer storage, such as disk storage and tape storage, they lose all data when the computer is powered down.

Non-Volatile Memory (NVM) is a type of computer memory which does not lose its information when power is turned off. NVM is used in computer systems, routers and other electronic devices to store settings which must survive a power cycle (like number of disks and memory configuration). One example is the magnetic core memory that was used in the 1950s and 1960s.

The many types of NVM under development are based on various technologies, such as carbon nanotube technology, magnetic RAM (MRAM) based on the magnetic tunnel effect, Ovonic PCM Memory based on phase-change technology, and FeRAM based on the ferroelectric effect. Today, most NVM is Flash memory based on Floating Gate technology, and is used primarily in cell phones, digital cameras and portable MP3 players.

Flash memory is non-volatile, which means that it does not need power to maintain the information stored in the chip. In addition, flash memory offers fast read access times (though not as fast as volatile DRAM memory used for main memory in PCs) and better shock resistance than hard disks. These characteristics explain the popularity of flash memory for applications such as storage on battery-powered devices.

The first flash memory products stored information in an array of floating gate transistors, called "cells", each of which traditionally stored one bit of information. Newer flash memory devices, sometimes referred to as multi-level cell (MLC) devices, can store more than 1 bit per cell, by varying the number of electrons placed on the floating gate of a cell.

Typical computer memory endurance requirement is 10,000 to 1,000,000 program/erase cycles. In some memory devices, called EEPROM, each program operation programs one byte (8 bits) in parallel, and each erase operation erases one page (about 1024 bytes) in parallel. In other memory devices, such as Flash memories, the erase operation erases an entire sector, called "Erase Sector" or "Block". An erase sector may contain typically 64 or 128 pages.

Another feature characteristic of Flash memories is that each program/erase cycle starts by erasing an entire erase sector, setting the value of all bits to "1", and then programming to "0" the specific bits that need to carry that respective information.

Because of the particular characteristics of flash memory, it is best used with specifically designed file systems which spread writes over the media and deal with the long erase times of flash blocks. The basic concept behind flash file systems is: when the flash store is to be updated, the file system will write a new copy of the changed data over to a fresh block, remap the file pointers, then erase the old block later when it has time.

One limitation of flash memory is that although it can be read or programmed a byte or a word at a time in a random access fashion, it must be erased a "block" or "sector" at a time. Starting with a freshly erased block, any byte within that block can be programmed. However, once a byte has been programmed, it cannot be changed again until the entire block is erased. In other words, flash memory (specifically NOR flash) offers random-access read and programming operations, but cannot offer random-access rewrite or erase operations.

When compared to a hard disk drive, a further limitation is the fact that flash memory has a finite number of erase-write cycles (most commercially available EEPROM products are guaranteed to withstand $10^6$ programming cycles), so that care has to be taken when moving hard-drive based applications to flash-memory based devices such as CompactFlash. This effect is partially offset by some chip firmware or file system drivers by counting the writes and dynamically remapping the blocks in order to spread the write operations between the sectors, or by write verification and remapping to spare sectors in case of write failure.

Generally, during the normal operation of flash memory devices, the various write sectors are cycled evenly so that one part of the flash memory device does not become more worn over time than another part. Thus, all of the write sectors wear at about the same rate with respect to cycle count.

Since blocks or sectors degrade and eventually fail with usage, it is common to provide "spare" blocks to replace those primary blocks that have failed. However, in the prior art, the determination of how many spare blocks to provide is much more of a guess than a science. As a result, flash memory designers tend to provide too many spares, increasing the cost of the flash memory devices.

Moreover, there are no standards and no published methods that suggest how to verify that a product with a given number of spare blocks indeed meets its long-life reliability target, having sufficient number of spare blocks with respect to its physical degradation modes, rate of bad block generation and spare block consumption.

These and other limitations of the prior art will become apparent to those of skill in the art upon a reading of the following descriptions and a study of the several figures of the drawing.

SUMMARY

In certain exemplary embodiments, a flash memory device with optimized write sectors has a plurality of flash memory write sectors and N flash memory spare sectors. Cumulatively, the flash memory write sectors correspond to the specified storage capacity of the flash memory. The number N of spares is approximately equal to the number of write sectors expected to be decommissioned within an operational lifetime of the flash memory.

In certain embodiments, set forth by way of example and not limitation, the N spare blocks are not pre-designated, physically distinguishable, or a-priory marked as spare blocks. Rather, the spare blocks may be extra non-designated and non-marked blocks of a product having more blocks than its specified storage capacity.

In an embodiment, N is no less than the expected number of write sectors expected to be decommissioned. In other embodiments, N is no greater than 10-20% more than the number of write sectors expected to be decommissioned.

In an embodiment, N=I+R, where I is the number of expected infant failures of the write sectors, and R is the number of expected random failures of the write sectors during the product lifespan. In another embodiment, I is determined in an empirical manner by writing to a first set of test write sectors. In another embodiment, R is determined in an empirical manner by writing to a second set of test write sectors which is smaller than the first set of test write sectors. In another embodiment, I and R are determined with the same set of test write sectors. In other embodiments, the operational lifetime is determined by writing to the same or different test write sectors as used by the I determination and/or the R determination. The first and second set of test write sectors may be an accumulation of sectors of different units, each unit having a plurality of write sectors, in an exemplary embodiment.

A method, by way of non-limiting example, of making flash memory includes specifying a plurality P of write sectors which define a specified storage capacity of a flash memory device, determining a number N of spare sectors, and making a flash memory device with about P write sectors and about N spare sectors.

By way of non-limiting example, the number N may be developed by determining the number I of infant failures, the number R of random failures, and calculating N =I+R. In an embodiment, the number I is determined empirically by writing to a first set of test sectors, and the number R is determined empirically by writing to a second set of test sectors.

In an embodiment, the second set of test sectors is smaller than the first set of test sectors. In another embodiment, the first set of test sectors is smaller than the second set of test sectors. In another embodiment, the first set of test sectors and the second set of test sectors are the same size. In another embodiment the first set of test sectors and the second set of test sectors are the same. In another embodiment, the first set of test sectors and the second set of test sectors overlap.

In an embodiment, the specified operational lifetime is determined empirically by writing to a set of test sectors. In an alternate embodiment, the set of test sectors is the first set of test sectors. In an alternate embodiment, the set of test sectors is the second set of test sectors. In an embodiment, the set of test sectors is separate from the first set of test sectors and the second set of test sectors. In another embodiment, the set of test sectors at least partially overlaps with at least one of the first set of test sectors and the second set of test sectors.

In an embodiment, set forth by way of non-limiting example, the number N is determined by developing a "bathtub curve" for the plurality P of write sectors including an infant mortality region, a random failure region, and a wear out region. The bathtub curve is then used to approximate the number N of spare sectors to be included in the products.

In an embodiment, developing the bathtub curve is accomplished empirically by writing to test write sectors and monitoring for degradation and failure of the test write sectors. In certain embodiments, infant mortality is determined by writing to a first set of test write sectors and random failure is determined by writing to a second set of test write sectors.

In another embodiment, N is approximated by integrating under the bathtub curve at the infant mortality and random failure regions. In other embodiment, N is approximated from the bathtub curve by other methods, including integral approximation, summation techniques, and other techniques known to those skilled in the art.

An advantage of certain embodiments is that a flash memory device is provided which has the statistically correct number of spare sectors. As such, a more economical and efficient flash memory device is provided.

An advantage of certain alternate embodiments is that a method is provided which permits the efficient and rapid determination of the number of spare sectors that should be provided, eliminating the guesswork that was prevalent in the prior art.

The preceding summary of certain exemplary embodiments and certain exemplary advantages is not meant to be exclusive. These and other embodiments and advantages will become apparent to those of skill in the art upon a reading of the following descriptions and a study of the several figures of the drawing.

BRIEF DESCRIPTION OF THE DRAWINGS

Several exemplary embodiments will now be described with reference to the drawings, wherein like components are provided with like reference numerals. The exemplary embodiments are intended to illustrate, but not to limit, the invention. The drawings include the following figures.

DETAILED DESCRIPTION OF EXEMPLARY EMBODIMENTS

Figure 1:
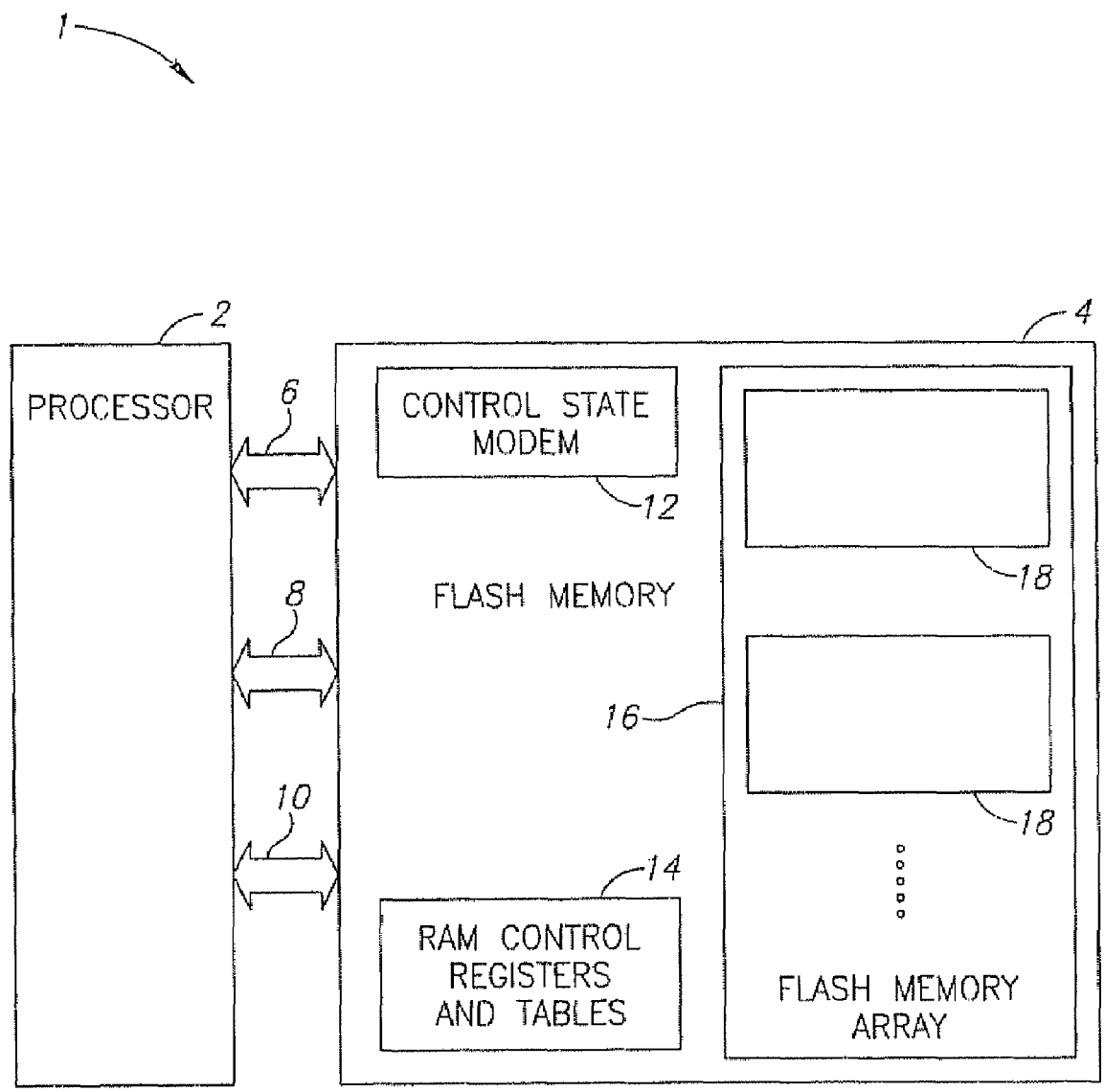
FIG. 1 is a block diagram of a flash memory device.

FIG. 1 is a block diagram depicting an exemplary embodiment wherein a processor 2 is coupled to a flash memory device 4. Processor 2 is connected to flash memory device 4 by address bus 6, control bus 8 and data bus 10. Disposed within flash memory device 4 is a control state machine 12 which may be comprised of discreet logic or a microcontroller. Also included within flash memory device 4 are RAM control registers and table 14. Also disposed within flash memory device 4 is flash memory array 16. Flash memory array 16 is composed of a plurality of physical sectors 18 which serve as the main storage for flash memory device 4. In an exemplary embodiment, processor 2 communicates with flash memory device 4 via address bus 6, control bus 8 and data bus 10. In one embodiment, processor 2 has direct access to RAM control registers and tables 14. In another embodiment, processor 2 accesses RAM control registers and tables 14 via media of control state machine 12. Control state machine 12 is generally responsible for enforcing the protocol between processor 2 and flash memory device 4 as well as orchestrating access to RAM control registers and tables 14 and flash memory array 16. Control state machine 12 utilizes RAM control registers and tables 14 to keep track of information needed during the various operations performed on flash memory allay 16. RAM control registers and tables 14 contains transient information which is needed to support and manage the IO operations performed to flash memory array 16. Since RAM control registers and table 14 is comprised, in a preferred embodiment, of volatile memory, it is necessary to have a backing store for any information for which persistence is required. In a preferred embodiment, said persistent information is stored within a reserved area of flash memory array 16. During normal operation of processor 2, it is generally necessary to perform read and write operations to the data storage provided by flash memory device 4. When performing a read operation, processor 2 transmits address information on address bus 6 and control information on control bus 8 which is received by control state machine 12. Control state machine 12 accesses RAM control registers and tables 14 to determine the physical sector 18 associated with the address information on address bus 6. Once it is determined which physical sector 18 is being accessed, additional address information on address bus 6 is used to access the specific portion of physical sector 18 which is being requested. The data is then returned on data bus 10 to processor 2. A write operation performed by processor 2 would be carried out by placing address information on address bus 6 as well as control information on control bus 8 and data on data bus 10. Control state machine 12 receives the control information on control bus 8 indicating that a write operation is being performed. Control state machine 12 then accesses the address bus 6 to determine which portion of the flash memory array 16 is being accessed. This address information is used to access RAM control registers and tables 14 and map the address on address bus 6 to a physical address within flash memory array 16. In some cases, this will involve allocation of physical blocks within flash memory array 16, thus altering the data structures contained within RAM control registers and tables 14. Control state machine 12 controls the data transfer of the data from data bus 10 into flash memory array 16, and more specifically, into the physical sector 18 to which the address on address bus 6 maps.

Figure 2:
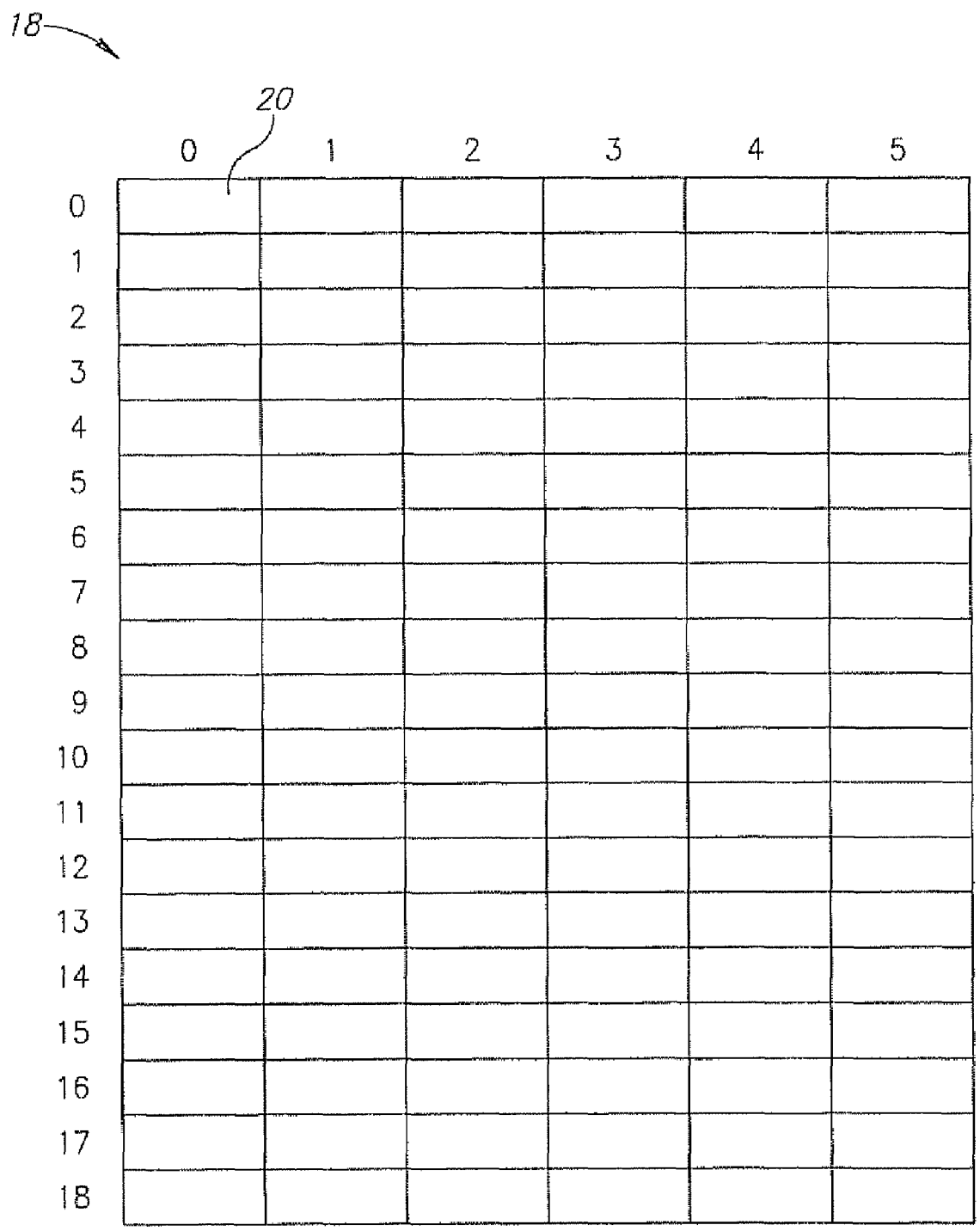
FIG. 2 is a diagram depicting the erase sectors within a physical sector of the flash memory device of FIG. 1.

FIG. 2 shows a physical sector 18 of FIG. 1 in greater detail. Physical sector 18 is comprised of a grid of erase sectors 20. In a preferred embodiment, the erase sectors 20 are arranged in a grid with 19 rows and 6 columns. Each erase sector 20 constitutes a portion of flash memory which, when it is erased, must be treated as a single unit. This is why it is called an erase sector 20. When the address on address bus 6 is translated through RAM control registers and tables 14 by control state machine 12, a physical address is obtained. The low order bits of the physical address specify which erase sector 20 within the physical sector 18 is to be accessed. The low order bits also specify what portion of erase sector 20 is to be accessed. When one writes to or erases an erase sector 20, one activates certain bit lines 24 (not shown) which run vertically through physical sector 18 and word lines 26 (not shown) which run horizontally through physical sector 18. Thus, the various data storage elements of physical sector 18 are electrically connected to one another by these vertical and horizontal connections. When erasing an erase sector 20, the voltages on bit lines 24 and word lines 26 are set to a level appropriate for erasure of the specific erase sector 20 that is being erased.

Figure 3:
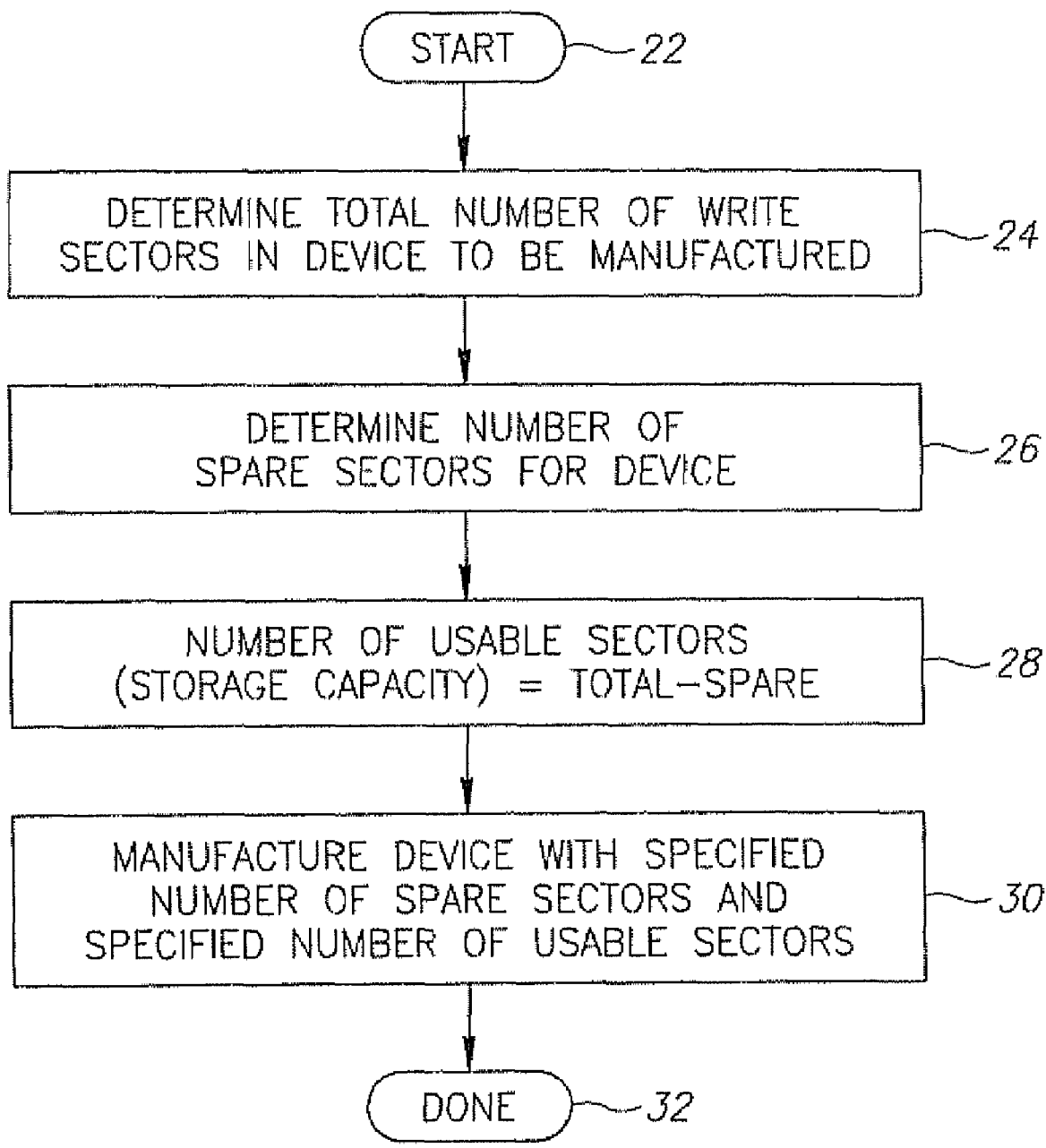
FIG. 3 is a flow diagram depicting a manufacturing process including a determination for a number of spare sectors for the flash memory device of FIG. 1.

FIG. 3 is a flow diagram describing an exemplary manufacturing method for flash memory device 4. The process begins in an operation 22 and continues in an operation 24 wherein a total number of erase sectors in flash memory device 4 is determined prior to the manufacture of flash memory device 4. As mentioned previously, flash memory device 4 comprises flash memory arrays 16. Flash memory array 16 comprises one or more physical sectors 18 as seen in FIG. 1. As shown in FIG. 2, each physical sector 18 is comprised of a plurality of erase sectors 20, also referred to herein as write sectors. The total number of write sectors in flash memory device 4 is obtained by multiplying the total number of physical sectors 18 in flash memory array 16 by the number of erase sectors 20 which are present in a single physical sector 18. In an operation 26, a number of spare sectors for flash memory device 4 is determined. The process for determining the total number of spare sectors also known as write sectors or erase sectors 20 is empirical and involves modeling the failure rate of the write sectors over the lifetime of flash memory device 4. The spare sectors are intended to be swapped with decommissioned write sectors as they fail. It is essential to obtain an accurate model for the failure of the write sectors in flash memory device 4 so that the flash memory device 4 will have enough spare sectors to last for its target lifetime. In an operation 28, a number of usable sectors which represent the storage capacity of flash memory device 4 is calculated as being equal to the total number of write sectors in flash memory device 4 determined in operation 24 minus the number of spare sectors for flash memory device 4 determined in operation 26. The number of usable sectors representing the storage capacity of flash memory device 4 comprises the number of write sectors that may contain user data or other data necessary for the normal operation of flash memory device 4. For example, flash memory device 4 may require the use of one or more write sectors dedicated to the storage of error correction code data. This data is used to assist in detecting and correcting errors that occur in other write sectors on flash memory device 4. Additionally, some write sectors may be reserved for control information required by control state machine 12. These reserved write sectors comprise a backing store for RAM control registers and tables 14 as will be appreciated by those skilled in the art. It is contemplated that other write sectors may be reserved as well. All of these various uses of write sectors are understood to be accounted for by the number of usable sectors computed in operation 28. In an operation 30, flash memory device 4 is manufactured with a specified number of spare sectors and specified number of usable sectors computed in operations 26 and 28 respectively. The method used in operation 30 is well known to persons of skill in the art. The operation is concluded in an operation 32.

Figure 4:
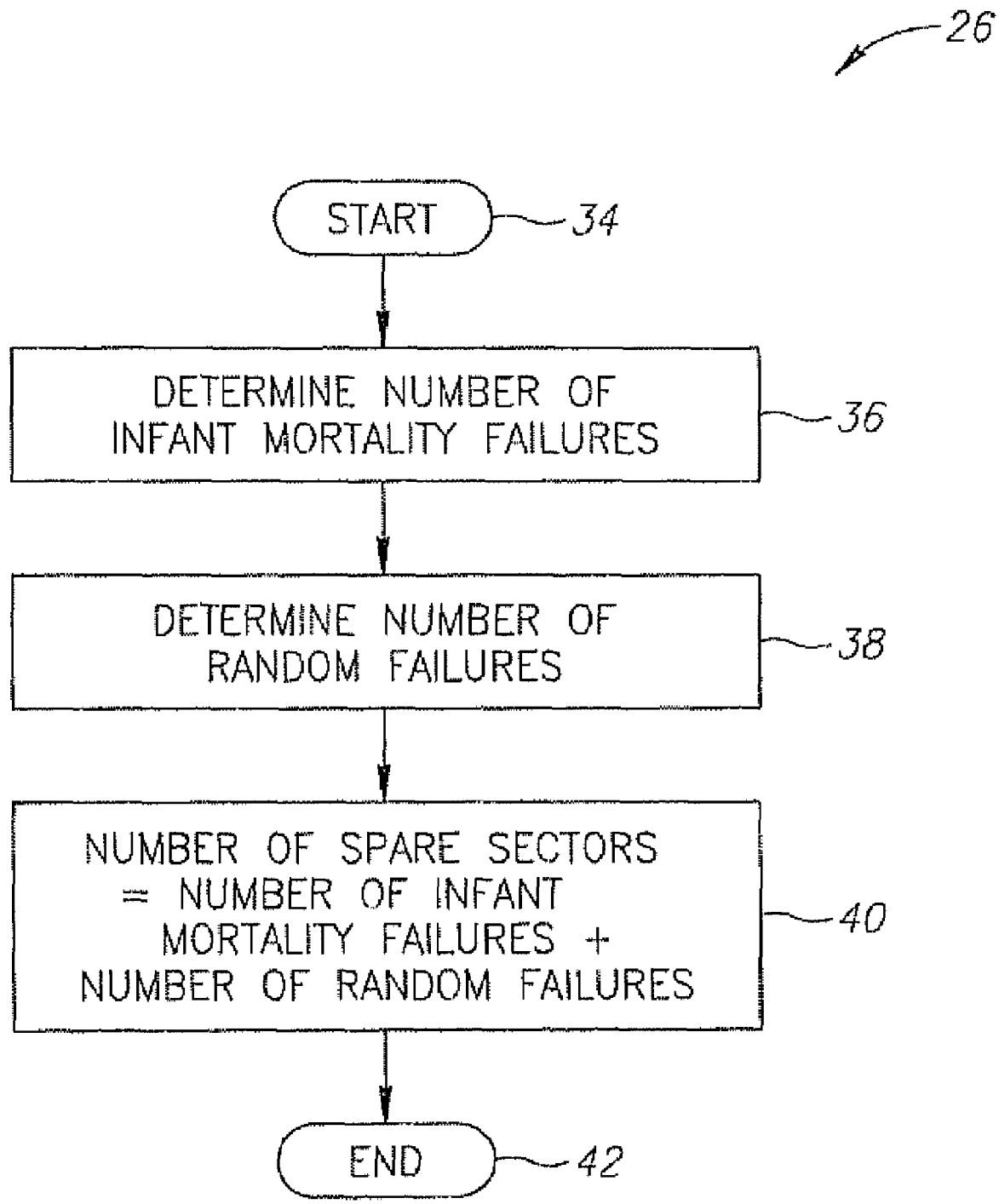
FIG. 4 is a flow diagram depicting a process of determining a number of spare sectors referenced in FIG. 3.

FIG. 4 is a flow diagram showing an exemplary operation 26 of FIG. 3 in greater detail. The operation begins in an operation 34 and continues in an operation 36 in which the number of infant mortality failures of write sectors in flash memory device 4 is determined. Infant mortality failures refer to defective write sectors in flash memory device 4. Infant mortality failures are generally due to manufacturing processes and the various imperfections associated with said processes. Nearly all complex systems manufactured by human beings experience an elevated failure rate immediately following the manufacturing process. These failures are expected and are considered normal for the operation of flash memory device 4. In an operation 38, a number of random failures is determined. Random failures occur after the infant mortality phase has ended and the failure rate has leveled off. Random failures of write sectors in flash memory device 4 occur due to the repeated erasure and writing of said write sectors. Each write sector can endure a finite number of cycles wherein each cycle involves an erasure and a programming. These random failures occur during the normal expected lifespan of flash memory device 4 and begin to increase at the end of life of flash memory device 4. In an operation 40, the number of spare sectors is computed as being equal to the number of infant mortality failures plus the number of random failures computed in operations 36 and 38, respectively. The operation is concluded in an operation 42. As an exemplary definition, a "lifespan" of a memory device can be expressed in terms of number of erasure-programming cycles that is equal to or smaller than the number of cycles it takes to reach the end-of-life increased failure rate. Other definitions will be apparent to those of ordinary skill in the art.

Figure 5:
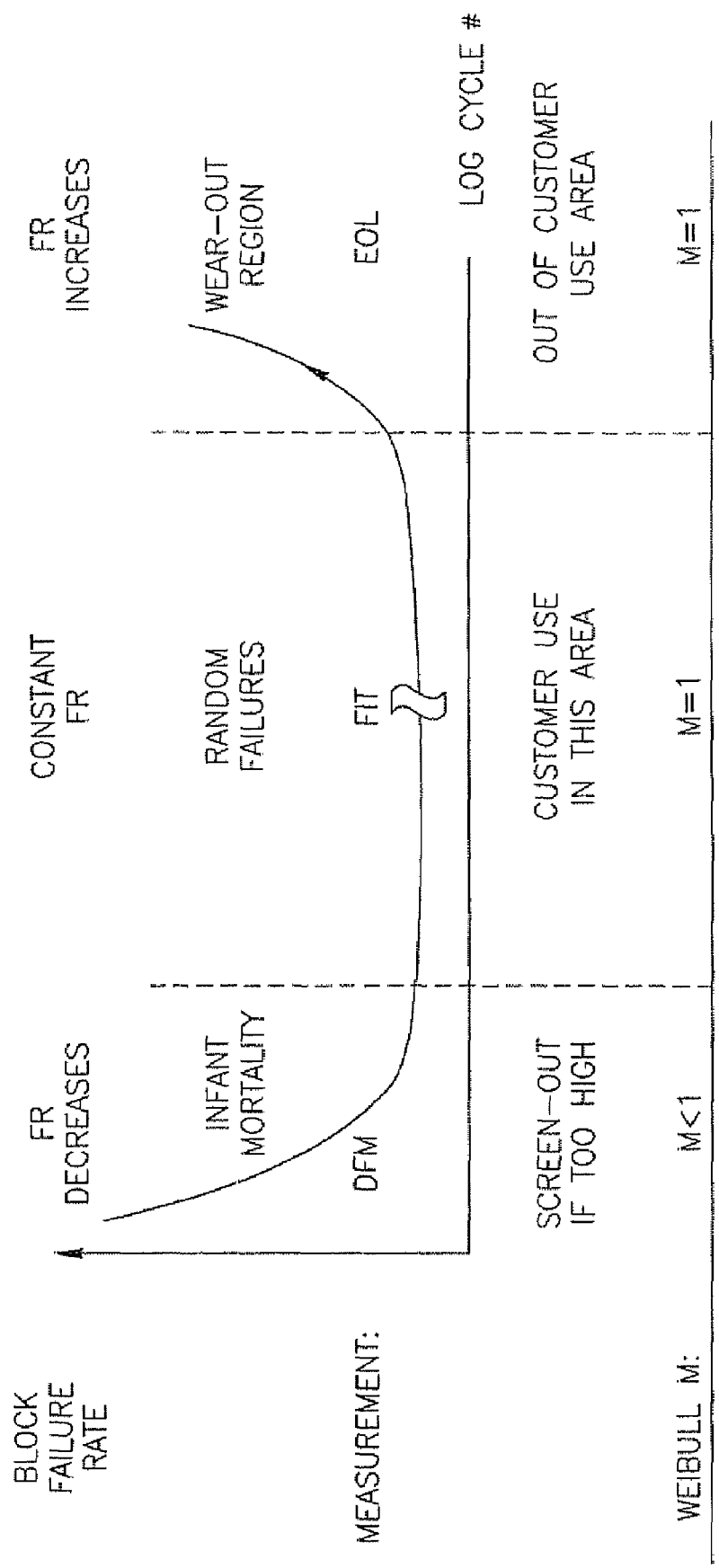
FIG. 5 is a diagram of a bathtub curve.

FIG. 5 is a graph of block failure rate during the lifetime of flash memory device 4. After the infant mortality period, the failure rate levels off at a low level during the random failure period and, then, at the end of the random failure period the failure rate again increases during the end of life period. The initial high rate, the low random failure rate and the high end of life failure rate combine to form a graph in the shape of a bathtub. The area under this exemplary graph (i.e. the integral function of the curve) is related to and/or proportional to the Cumulative Failure Rate (CFR). The rapidly decreasing failure rate in the infant mortality phase and the rapidly increasing failure rate in the end of life phase can be modeled using mathematics developed by a mathematician named Weibull. The Cumulative Failure Rate shown in this graph can be modeled in pieces using the following equation:

$$CFR = 1 - \exp[-(c/\xi)^m]$$

This exemplary equation is a modified form of an equation developed by Weibull for cumulative failures in the time domain. It expresses Cumulative Failure Rate as a function of cycle count. Cumulative Failure Rate in this invention is defined as the fraction of cumulative failed blocks out of the total number of cycled blocks plus one, after cycle c. The variable c stands for cycle count; the parameter $\xi$ is a Greek symbol denoting characteristic life expressed in cycles. This constant is also known as the scale constant, which defines the scale of this Weibull curve with respect to cycle count. A value of, for example, 10 cycles is typical for $\xi$ when dealing with the infant mortality period of a mature manufacturing process of NVM devices.

The constant m is used to specify the specific shape of the Weibull curve. This constant is derived from the slope of experimental data which is plotted in a log cycle count domain. This value can be obtained graphically or through the use of linear regression techniques as are well known to those skilled in the art. The constant m is less than 1 during the infant mortality period and is greater than 1 during the end of life period. Since the cumulative failure rate is statistically constant during the random failure period, m is equal to 1 during the random failure period. It should be appreciated that at the point where the failure rate of the infant mortality regime equalizes the rate of random fails the shape of the bathtub curve tends to level off.

The constants $\xi$ and m may be, by way of example and not limitation, derived experimentally for the infant mortality portion of the curve. Different values of these constants are derived for the random failure portion of the bathtub curve and for the end of life period. The constants $\xi$ and m control the scale and shape of the Weibull curve in each section of the bathtub curve, respectively. It is possible to model the failure rate of the flash memory device 4 with respect to cycle count and thus it is possible to predict the fraction of blocks of a flash memory unit that will have failed at any given cycle count. This is done by combining the infant mortality CFR and the random failure CFR from cycle count zero up to the desired cycle count. Various other uses of this kind of model will be appreciated by those skilled in the art. Since the failure rate increases exponentially at the end of life, it is generally considered inefficient to attempt to extend the life of flash memory device 4 by attempting to reserve spare sectors beyond those that are required in the infant mortality and random failure periods. The shape of the cumulative failure rate curve during the end of life period is such that the failure rate increases as usable blocks are decommissioned. Thus, the reserved blocks would dwindle rapidly unless their number rivaled that of the usable blocks.

Figure 6:
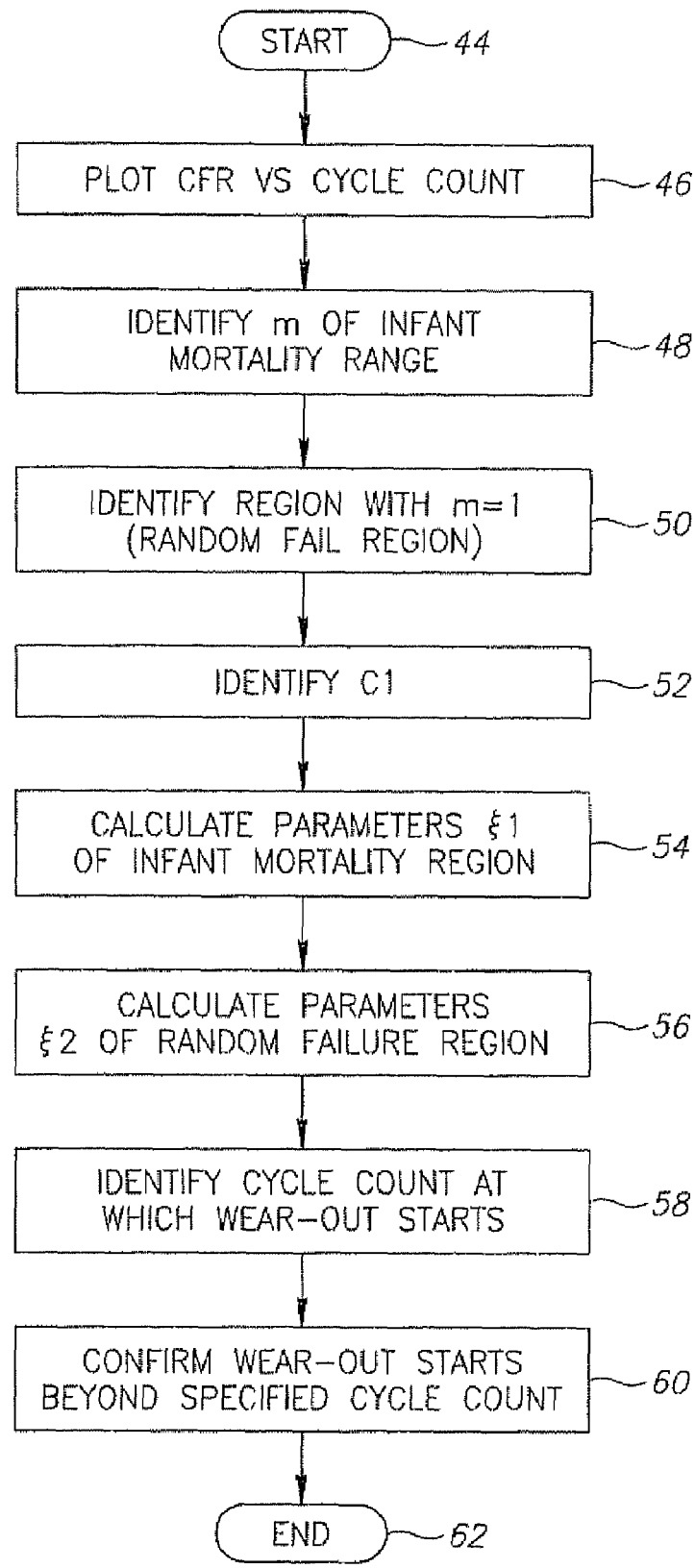
FIG. 6 is a flow diagram depicting a process for generating various values referenced in FIG. 4.

FIG. 6 is a flow diagram which describes an exemplary process of generating the model for predicting cumulative failure rate. A byproduct of this model is that it is very easy to determine the number of failures at any point during the life of the product once the model is available. Thus, it is easy to compute the number of infant mortality failures described in operation 36 of FIG. 4 or the number of random failures described in operation 38 of FIG. 4. The operation begins in an operation 44 and continues in an operation 46 wherein the blocks' Cumulative Failure Rate (CFR) is plotted vs cycle count in the log domain. The process for computing the CFR involves taking a number of measurements with a test set of flash memory devices 4. In one embodiment, 240 flash memory devices 4 are used to form an array which is exercised at various cycle counts in order to extract failure data throughout the infant mortality period and beyond. When transformed properly and plotted in the proper domain, the data acquired produces an approximately linear function. The slope can then be derived mathematically by linear regression or alternatively it can be derived through the use of graphic analysis or otherwise.

In an operation 48, the constant m is determined with respect to the infant mortality region shown in FIG. 5. As mentioned previously, m is, in this exemplary embodiment, the slope of a linear function of CFR in the log domain. In operation 50 it is determined when the cycle count reaches a point where the rate of failures levels out. The region in which the value of m is nearly 1 is identified as the random fail region. In operation 52 the cycle count C1 is determined. C1 is the point at which the failure rate in the infant mortality region equalizes the rate of failures in the random failure region of the bathtub curve of FIG. 5.

In operations 54 and 56, the parameters $\xi_1$ and $\xi_2$ of the infant mortality region and of the random failure region, respectively, are determined from the data of the cumulative failures plotted against the cycle count. In operation 58, it is determined at what cycle count the random failure region ends and the end of life region begins. This can be done by, for example, determining the knee in the CFR plot that indicates the change from flat value of m to a regime where m>1. This transition may be observed only at relatively high cycle counts, e.g. above 100,000 cycles.

It should be noted that it is often considered impractical to reach a high cycle count such as 100,000 cycles with a large ensemble such as the one used to measure m in the infant mortality region. It is contemplated that a smaller ensemble of units would preferably be used for measuring high cycle counts such as 100K. The number of units chosen also depends on the quality target.

Then, in operation 60, it is verified that the wear-out region starts beyond the cycle count that is specified as the reliability target of the specific product. The operation is concluded in an operation 62.

Figure 7:
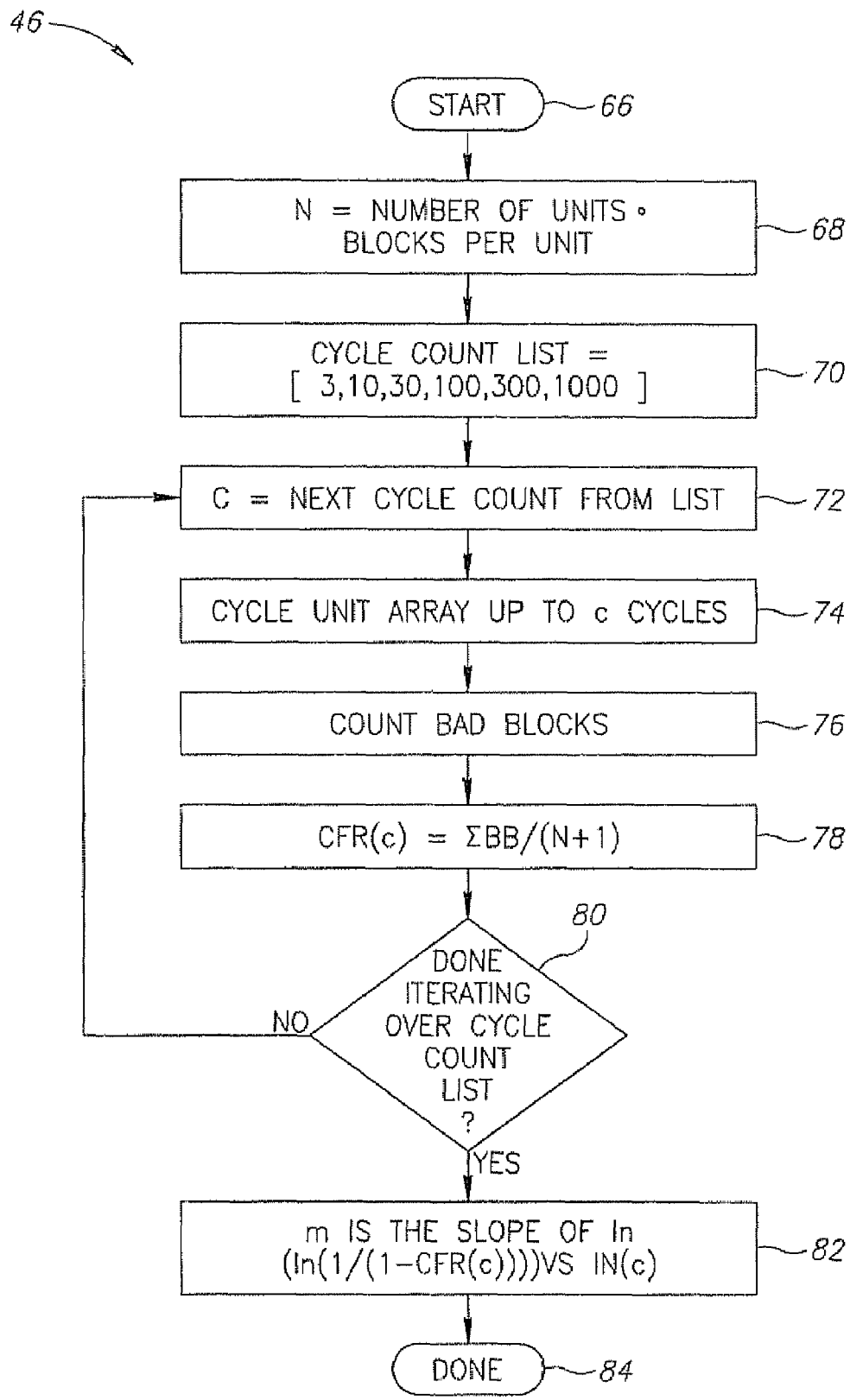
FIG. 7 is a flow diagram depicting a process for determining the value of a constant m as referenced in FIG. 6.

FIG. 7 is a flow diagram of operations 46-48 of FIG. 6 shown in greater detail. The operation starts in an operation 66 and continues in an operation 68 wherein a number of blocks in a test ensemble is computed as being equal to the number of units in the ensemble times the number of blocks per unit that undergo cycling. In an operation 70, a cycle count list is introduced, which contains entries for various cycle counts at which block failures in the test ensemble should be measured. Next, in an operation 72, a cycle count c is set to the value of the next item in the cycle count list of operation 70. Then in an operation 74, the test ensemble is exercised such that the wear on each block in each unit in the ensemble reaches the value specified by c. In an operation 76 a count is made of the blocks that have failed. Next, in an operation 78, a calculation of CFR is made for the cycle count specified by c. This is the sum of bad blocks divided by the number of blocks in the ensemble plus one. This measurement is stored for later use. Next, in a decision operation 80 it is determined whether or not the cycle count list has been exhausted. If it has not been exhausted, control returns to operation 72. If it has been exhausted, control passes to operation 82 wherein the constant m is determined. A 2D plot of the data collected during the test is made using the following expression to transform the value of the y axis:

$$\ln(\ln(1/(1-CFR(c))))$$

The following expression is used to transform the value of the x axis:

$$\ln(c)$$

Once the data is plotted in this manner, it should be immediately evident that a line is formed by the data points collected in operation 78. The constant m is the slope of this line, which can be measured on the plot using well known graphic analysis methods. Alternatively, the constant m may be measured using well known linear regression methods. Once the constant m has been derived, the operation may be concluded in an operation 84.

The flow diagram of FIG. 7 is a detailed description of operations 46-48 of FIG. 6 that pertain the determination of the parameter m and $\xi_1$ of the infant mortality region. The same flow may be repeated for cycle counts above C1 to verify the value m=1 and to determine the value of the parameter $\xi_2$ in the random failure region.

Once the model has been generated, it may be used for a variety of purposes as will be evident to those skilled in the art. For example, it may be used to qualify batches of units in large scale production. It may also, by way of non-limiting example, be used to measure the quality and reliability of different batches, or compare the quality and reliability of products from different sources.

It is contemplated that there may be different quality levels for products. For example, there might be three target quality levels for products that are intended to endure at least 100K cycles: A) Level A, corresponding to high quality, represents less than 500 DPM; B) Level B, corresponding to standard quality, represents less than 2K DPM; and C) Level C, corresponding to acceptable quality, represents less than 10K DPMs.

Corresponding to these three target quality levels are three Cumulative Block Failure Rate (CBFR) levels which are used when cycling beyond 1K cycles:

Level A, corresponding to high quality, represents 0.1% failing blocks in 100Kc. Level B, corresponding to standard quality, represents 0.1% failing blocks in 10Kc. Level C, corresponding to acceptable quality, represents 1% failing blocks in 10Kc. Other quality targets may be set according to the market requirements. There is therefore a method for estimating the number of write sectors expected to fail and/or otherwise be decommissioned during an array's lifetime. According to some embodiments of the present invention, information empirically derived about a given NVM array, batch of arrays, die or batch of dies may be used estimating: (1) the number of sector to fail and/or otherwise be decommissioned during a given array's lifetime, and (2) how many NVM spare sectors should be designated as spare sectors only to be used to replace decommissioned sectors upon decommissioning.

Such estimation may be empirically determined. Devices, such as non-volatile memory (NVM) die or chips (including chips with embedded NVM) are explicitly contemplated and disclosed.

Although various embodiments have been described using specific terms and devices, such description is for illustrative purposes only. For example, even though the exemplary embodiments have used Flash memory for the purposes of illustration, other embodiments can use other types of erasable solid state memory devices that are segmented into blocks, such as HDD and DRAM.

It will therefore be appreciated that words used herein are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A memory device with optimized write sector spares comprising:
 a plurality of memory write sectors corresponding to a specified storage capacity of a memory device; and
 N memory spare sectors, wherein N is associated with an estimated number of write sectors to be decommissioned within a specified operational lifetime of said memory device and the estimated number of write sectors to be decommissioned within a specified operational lifetime is substantially based on empirical data collected as part of production of said device.

2. A memory device as recited in claim 1 wherein N is no less than the estimated number of write sectors estimated to be decommissioned.

3. A memory device as recited in claim 2 wherein N is no greater than 20% more than the number of write sectors estimated to be decommissioned.

4. A memory device as recited in claim 3 wherein N is no greater than 10% more than the number of write sectors estimated to be decommissioned.

5. A memory device as recited in claim 1 wherein N=I+R; where I is the number of estimated infant failures and R is the number of random failures within the estimated operational lifetime of the memory device.

6. A memory device as recited in claim 5 wherein the number of estimated infant failures I is determined in an empirical manner by writing to a first set of test write sectors.

7. A memory device as recited in claim 6 wherein the number of estimated random failures R is determined in an empirical manner by writing to a second set of test write sectors which is smaller than said first set of test write sectors.

8. A memory device as recited in claim 7 wherein the specified operational lifetime is determined by writing to said second set of test write sectors until a wear out region is detected.

9. A method for making a memory device comprising:
 specifying a plurality P of write sectors which define a specified storage capacity of a memory device; and
 based on empirical data collected during production of the device determining a number N of spare sectors, wherein N is associated with the number of write sectors estimated to be decommissioned within a specified operational lifetime of said memory device.

10. The method for making a memory device as recited in claim 9, wherein determining the number N comprises:
 determining the number I of infant failures;
 determining the number R of random failures within the estimated operational lifetime of the memory device; and
 calculating N=I+R.

11. The method for making a memory device as recited in claim 10, wherein determining the number I is determined empirically by writing to a first set of test sectors.

12. The method for making a memory device as recited in claim 11, wherein the number of expected random failures R is determined in an empirical manner by writing to a second set of test write sectors which is smaller than said first set of test write sectors R.

13. The method for making a memory device as recited in claim 12, wherein the specified operational lifetime is determined by writing to said second set of test write sectors until a wear out region is detected.

14. The method for making a memory device as recited in claim 9, wherein determining the number N comprises:
   developing a bathtub curve for said plurality P of write sectors including an infant mortality region, a random failure region, and a wear out region; and
   using said bathtub curve to approximate the number N.

15. The method for making a memory device as recited in claim 14, wherein developing said bathtub curve comprises writing to test write sectors.

16. The method for making a memory device as recited in claim 14, wherein writing to test write sectors comprises writing to a first set of test write sectors to determine infant mortality and writing to a second set of test write sectors to determine random failures.

17. The method for making a memory device as recited in claim 15, using said bathtub curve to approximate the number N includes integrating under the bathtub curve under the infant mortality and random failure regions.

18. The method for making a memory device as recited in claim 14, wherein the transition from said infant mortality region to said random failure region is determined from the change in slope of the bathtub curve.

19. The method for making a memory device as recited in claim 18 and where said memory device is a non-volatile memory.

20. The method for making a memory device as recited in claim 19 and where said non-volatile memory is a flash memory device.

* * * * *